United States Patent [19]
Seki et al.

[11] Patent Number: 4,575,851
[45] Date of Patent: Mar. 11, 1986

[54] DOUBLE CHANNEL PLANAR BURIED HETEROSTRUCTURE LASER WITH PERIODIC STRUCTURE FORMED IN GUIDE LAYER

[75] Inventors: Masafumi Seki; Ikuo Mito, both of Tokyo, Japan

[73] Assignee: Nippon Electric Co., Ltd., Tokyo, Japan

[21] Appl. No.: 447,553

[22] Filed: Dec. 7, 1982

[30] Foreign Application Priority Data

Dec. 7, 1981 [JP] Japan ................................. 56-196493
Feb. 15, 1982 [JP] Japan ................................... 57-22544

[51] Int. Cl.$^4$ ............................................... H01S 3/19
[52] U.S. Cl. ........................................ 372/45; 372/46; 372/50; 372/96
[58] Field of Search ....................... 372/44, 45, 46, 48, 372/96, 50

[56] References Cited

U.S. PATENT DOCUMENTS 4,045,749  8/1977  Burnham et al. ...................... 372/96
4,425,650  1/1984  Mito et al. ............................. 372/46

OTHER PUBLICATIONS

Kobayashi et al., "CW Operation of 1.5–1.6 μm Wavelength GaInAsP/InP Buried-Heterostructure Integrated Twin-Guide Laser with Distributed Bragg Reflector", *Electronics Letters*, May 28, 1981, vol. 17, No. 11, pp. 366–368.

Walpole et al., "Distributed Feedback $Pb_{1-x}Sn_xTe$ Double-Heterostructure Lasers", Applied Physics Letters, vol. 29, No. 5, Sep. 1, 1976, pp. 307–309.

*Primary Examiner*—James W. Davie
*Attorney, Agent, or Firm*—Sughrue, Mion, Zinn Macpeak & Seas

[57] ABSTRACT

A double heterostructure semiconductor laser device has a first wide bandgap layer, forming an optical guide layer, a portion of which is provided with periodic corrugations to form a distributed Bragg reflector. The optical guide layer extends along a major surface of the substrate in the direction of laser propagation. A narrow bandgap active region over which is disposed a second wide bandgap region, forming a first cladding layer, are both disposed over a portion of the optical guide layer in the direction of laser propagation to produce an amplifier section. The remaining portion of the optical guide layer in the direction of laser propagation is disposed over that portion of the substrate containing the distributed Bragg reflector to thereby form a reflector section. First and second channels are formed in said device in the direction of laser propagation to produce a mesa, with additional cladding layers, forming current blocking layers, being disposed in said channels but not over the mesa, to electrically isolate said mesa.

17 Claims, 10 Drawing Figures

DOUBLE CHANNEL PLANAR BURIED HETEROSTRUCTURE LASER WITH PERIODIC STRUCTURE FORMED IN GUIDE LAYER

BACKGROUND OF THE INVENTION

The present invention relates to semiconductor lasers, and more particularly to a buried heterostructure semiconductor laser capable of single frequency operation and suitable for use in optical fiber communication or the like.

Conventional buried semiconductor lasers, though having such advantages as low lasing threshold current and stable fundamental transverse mode operation, involve a problem when they are to be used in long-distance large-capacity communication systems because of the heavy temperature dependence of their lasing wavelength and their great spectral width. To solve this problem, there has been an attempt to provide such a buried semiconductor laser with a resonator having an internal periodic structure instead of a cleavage facet. (See K. Kobayashi et al., "CW Operation of 1.5~1.6 m Wavelength GaInAsp/InP Buried-Heterostructure Integrated Twin-Guide Laser with Distilled Bragg Reflector", ELECTRONICS LETTERS, Vol. 17, No. 11 (May 28, 1981), pp. HH-368).

However, since only p-InP and n-InP layers bury an isolated reverse mesa stripe, the proposed structure has these disadvantages; (1) it is difficult to precisely control the burying; (2) the mesa stripe is susceptible to damage during the burying process, and it is accordingly difficult to obtain an efficient product, and (3) because the surface thus formed is not sufficiently flat, it is not suitable for an upside-down mounting, which is desirable for high-temperature operation. Furthermore, the structure in which integrated twin guides are separated by a separation layer makes it considerably difficult to achieve satisfactory coupling of an active layer and a guide layer constituting the twin guide.

SUMMARY OF THE INVENTION

An objective of the present invention, therefore, is to provide a semiconductor laser, which allows only one axial mode of oscillation.

Another objective of the invention is to provide a readily controllable and manufacturable semiconductor laser capable of a single axial mode of oscillation.

Still another objective of the invention is to provide a semiconductor laser of a single axial mode of oscillation suitable for high-temperature operation.

According to the present invention, a double heterostructure laser device comprises: a multilayered structure including a semiconductor substrate of one conductivity type, a wide bandgap first layer of the same conductivity type disposed on a major surface of said substrate, a narrower bandgap active region disposed on said first layer, and a wide bandgap second layer of the opposite conductivity type disposed on said active region, said active region being capable of emitting stimulated radiation when said layers are forward biased, one of said first and second layers forming a periodic structure having a prescribed pitch of thickness in the propagating direction of said radiation, said multilayered structure having the shape of an elongated mesa, which extends in parallel to the propagating direction of said radiation, forming channels along both sides thereof to such an extent that the two channels reach said first layer; wide bandgap third and fourth layers, opposite to each other in conductivity type, formed on said multilayered structure except for the top surface of said mesa for blocking a current flow therethrough; and electrode means for applying said forward bias.

In the laser device according to the invention, in order to form a mesa stripe including an active layer for laser oscillation, two channels are etched into a multilayered semiconductor wafer, until the bottom of the channels reaches at least a wide bandgap first layer, to leave the multilayered structure on both sides, with the result that the mesa strip is hardly susceptible to damage even during the burying process and, at the same time, the burying is readily controllable. Moreover, the invention has an effect to raise the breakdown voltage of the p-n-p-n structure formed by burial growth and to strictly suppress the current leaking outside the active layer. Therefore, the lasing threshold current of the semiconductor laser can be kept smaller, while achieving a high-output operation. Since the semiconductor laser is planar and its electrodes may be fullsurface ones, its structure is highly resistant to high- temperature operation. Furthermore, as the invention provides for the formation, first of all, of a periodic structure required for single-axial mode oscillation on the semiconductor substrate, the process affords a high yield, and the active layer is less susceptible to damage or deterioration than where a periodic structure is formed after the growth of an active layer. In addition, the present structure is free from the difficulty otherwise involved in the output photocoupling because it has only one waveguide path.

BRIEF DESCRIPTION OF THE DRAWINGS

Other advantages and features of the invention can be more readily understood from the more detailed description hereunder taken in conjunction with the accompanying drawings, wherein.

DESCRIPTION OF THE PREFERRED EMBODIMENTS

Figure 1:
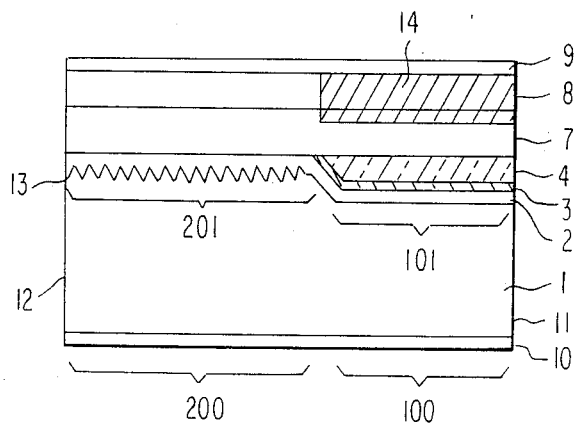
FIG. 1 shows a longitudinal cross section of a semiconductor laser with a Bragg reflector, which is a first preferred embodiment of the invention, cut in the direction of the oscillating axis.
Figure 2:
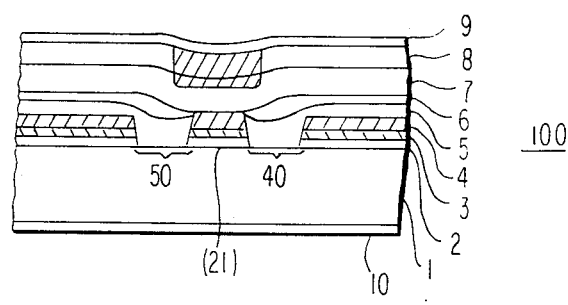
FIG. 2 shows a partial transverse cross section of the amplifier section of the first embodiment, cut in a direction normal to the oscillating axis.
Figure 3:
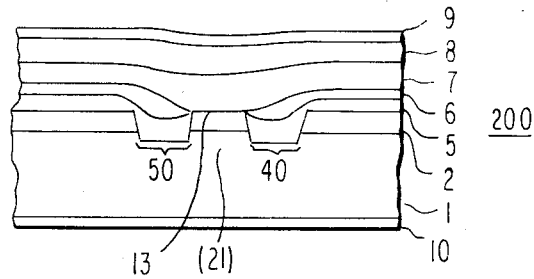
FIG. 3 shows a partial transverse cross section of the Bragg reflector portion, cut in a direction normal to the oscillating axis.
Figure 4A:
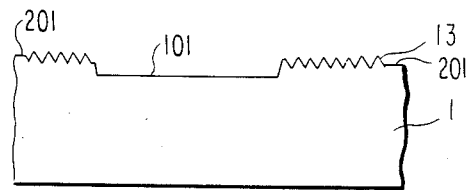
FIGS. 4(a) through 4(e) illustrate the semiconductor laser of the invention at various stages of the production process, with FIGS. 4(a) through 4(c) being partial longitudinal cross-sectional views and FIGS. 4(d) and 4(e) being partial transverse cross-sectional views.
Figure 4B:
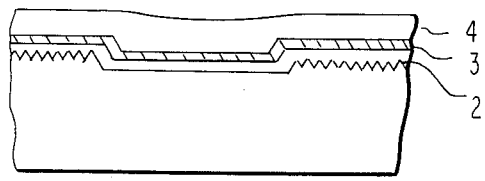
Figure 4C:
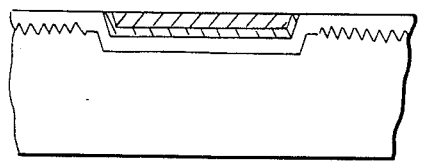
Figure 4D:
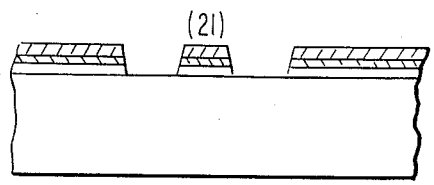
Figure 4E:
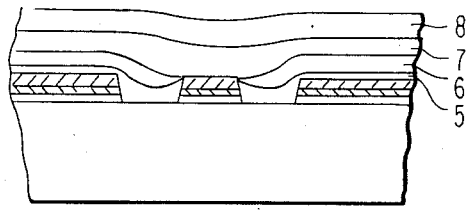

Referring to FIGS. 1, 2 and 3, a first preferred embodiment of the present invention has an amplifier section 100 and a Bragg reflector section 200. In a mesa 21 of the amplifier section 100, an active layer 3 and an optical guide layer 2 are buried under first, second, third and fourth cladding layers 4, 5, 6 and 7. In the mesa 21 of the Bragg reflector section 200, a periodic structure composed of an optical guide layer 2 and a substrate 1 is buried under second, third and fourth cladding layers 5, 6 and 7. The n-InP substrate 1 consists of a lower part 101 and a higher part 201, formed by etching. A holographic photolithography technique, using the two-beam interference method followed by chemical etching, is used to form a diffraction grating 13 on the higher part 201. The diffraction grating 13 has a pitch corresponding to ½ of the oscillation wavelength in the guide layer. An n-$In_{0.82}Ga_{0.18}As_{0.40}P_{0.60}$ optical guide layer 2, having a forbidden band wavelength (oscillating wavelength) of 1.15 microns ($E_g$=1.078 eV), is grown over the substrate 1. Over the portion of the optical guide layer 2 which is above the lower part 101, there are grown the $In_{0.72}Ga_{0.28}$, $As_{0.61}P_{0.39}$, active layer 3 having a forbidden band wavelength (oscillating wavelength) of 1.30 microns ($E_g$=0.95 eV) and the p-InP first cladding layer 4 ($E_g$=1.35 eV). Over the portion of the optical guide layer 2 which is above the higher part 201, and over the portion of the first cladding layer 4 which is above the lower part 101, there are grown the p-InP fourth cladding layer 7 and an n-$In_{0.72}Ga_{0.28}As_{0.61}P_{0.39}$ cap layer 8 having a forbidden band wavelength of 1.30 microns. Zinc is diffused from the portion of the cap layer 8 over the lower part 101 to the fourth cladding layer 7, thereby making the resistance between a first electrode 9 formed on the cap layer 8 and the fourth cladding layer 7 considerably lower in the region above the lower part 101 than elsewhere. A set of crystal layers, comprising the optical guide layer 2, the active layer 3 and the first cladding layer 4, in the area above the lower part 101 is divided by the formation of two channels 40 and 50 into three portions, the central of which constitutes the mesa stripe 21. In these two channels are embedded the p-InP second cladding layer 5, which makes up a first current blocking layer, and the n-InP third cladding layer 6, which constitutes a second current blocking layer. Neither the second cladding layer 5 nor the third cladding layer 6 is grown over the first cladding layer 4 of the mesa stripe 21. In the section above the higher part 201, the optical guide layer 2 is divided into three portions by the same two channels 40 and 50. As in the area above the lower part 101, there are embedded in these two channels the second cladding layer 5 and the third cladding layer 6. A second electrode 10 is formed underneath the substrate 1. Facets 11 and 12 are formed by cleavage at the opposite ends of the mesa.

Light travels through the active layer 3 and the optical guide layer 2 in the amplifier section 100, and through the optical guide layer 2 in the Bragg reflector section 200. The active layer 3 in the amplifier section 100 is forward biased to amplify light having a wavelength of approximately 1.3 microns. A cleaved facet 11 reflects in the reverse direction the light traveling through the active layer 3 while the optical guide layer 2, and the diffraction grating 13 reflects in the reverse direction the light travelling through the optical guide layer 2. By these actions, this preferred embodiment of the present invention accomplishes laser oscillation at a wavelength of 1.3 microns.

FIG. 4 illustrates how this preferred embodiment of the invention is produced. First, as shown in FIG. 4(a), the central part of the n-InP substrate 1 having a plane orientation of (100) is chemically etched to 0.5 micron in depth with a photoresist used for masking to form a lower part 101, and higher parts 201. Corrugations 13 composed of numerous grooves and formed by the two-beam interference exposure technique using He-Cd laser and by chemical etching are formed on the surfaces of the higher parts 201. The direction of each groove is perpendicular to the oscillating axis (<011> direction) of the semiconductor laser. The corrugations 13 have a pitch of 3,840 Å and a depth of 900 Å. Next, over the whole surface of the substrate 1 are expitaxially grown the optical guide layer 2, the active layer 3, and the first cladding layer 4 (FIGS. 4 (a) and (b)). The optical guide layer 2 and the active layer 3 are respectively 0.3 micron and 0.1 micron in thickness, and the first cladding layer 4 is grown thick to have a substantially flat surface. A corrugation 13 with the guide layer 2 embedded in its grooves constitutes a diffraction grating. The upper part of this structure is then chemically etched until the optical guide layer 2 is exposed (FIG.4 (c)). Following this etching, two channels, each about 8 microns wide, are etched until their bottoms reach the substrate 1 of a lower part 101 (FIG. 4 (d)). This forms the mesa stripe 21 extending in the direction of oscillating axis (<011> direction). The width of the mesa stripe 21 is so selected as to be about 1.5 microns in the active layer 3 region. A second round of epitaxial growth is then achieved to form the second, third and fourth cladding layers 5, 6 and 7 and the cap layer 8 (FIG.4 (e)). So that neither the second cladding layer 5 nor the third cladding layer 6 may grow over the first cladding layer 4 of the mesa stripe 21, it is recommended not to make the mesa width greater than 5 microns and to use the two-phase solution technique under the conditions of 620° C. in growth start temperature, 630° C. in soak temperature and 0.7° C./min in cooling rate. Next, after zinc is diffused only in the portion directly above the active layer 3 in the mesa stripe 21 to reach the fourth cladding layer 7, an AuZn-Ti-Pt-CrAl-CuAu first electrode 9 is formed over the whole top surface of the wafer, and the AuGeNi-CrAu second electrode 10 over the whole bottom surface thereof. By cleaving the wafer so far processed in a direction normal to the mesa stripe 21 in a position about 150 microns off the step of the substrate in the direction toward the lower part 101, and by cutting it off at a position 220 microns towards the higher part 201, there is provided a distributed reflection type semiconductor laser. As is apparent from the foregoing description, in this distributed reflection type semiconductor laser, the active layer 3 and the optical guide layer 2 are buried in the amplifier section 100, the optical guide layer 2 is buried in the Bragg reflector section 200, and on the boundary of the optical guide layer 2 of the Bragg reflector section is formed the diffraction grating 13, which serves as a distributed reflector.

In this embodiment, two rounds of epitaxial crystal growth provide a distributed reflector type semiconductor laser of a buried structure. Moreover, since the diffraction grating 13, which is the distributing reflector, can be formed before the start of epitaxial growth, high-yield laser production can be achieved.

Furthermore, because the second cladding layer 5 and the third cladding layer 6, which serve as current blocking layers, give a p-n-p-n structure except in the mesa and there remain the same layers as the active layer outside the grooves on both sides of the mesa, the breakdown voltage of the p-n-p-n structure is high, so that the leak current flowing out of the active layer can be kept extremely small.

This embodiment can be modified in such a manner that the forbidden band wavelength is not limited to 1.3 microns but may also be, for instance, 1.5 microns. If a wavelength of 1.5 microns is selected, it will be permissible to facilitate the crystal growth over the active layer 3 by adding another layer of quarternary crystals having a forbidden band wavelength of around 1.3 microns. Besides the crystal composition used in this embodiment, a layer of InP or quarternary crystals may also be inserted.

The conductivity type of the substrate 1 may be the p type. In that case, the conductivity types of other grown layers will have to be opposite to those of the corresponding layers of this embodiment. Further, the substrate 1 and the quarternary crystals may be something other than InP and $In_{l-x}Ga_xAs_yP_{i-y}$ ($0 \leq x$, $y \leq 1$). Although the cleaved facet 11 is used as one of the reflectors in this embodiment, it can be replaced with a distributed reflector consisting of a diffraction grating. In that case, it will be desirable to make the diffraction grating of the optical guide layer 2 on the light output side shorter than the other diffraction grating to achieve good output coupling.

Figure 5:
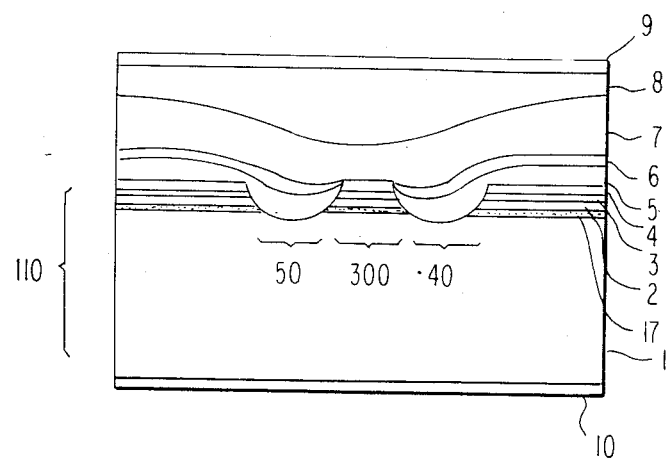
FIG. 5 shows a transverse cross section of a second embodiment, which is a distributed feedback semiconductor laser, cut in a direction normal to the oscillating axis.
Figure 6:
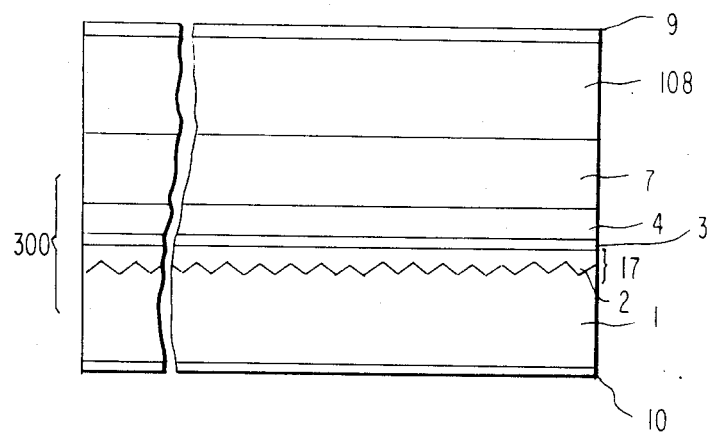
FIG. 6 shows a longitudinal cross section of the second embodiment, inclusive of the mesa, cut in the direction of the oscillating axis.

A second preferred embodiment of the present invention is illustrated in FIGS. 5 and 6. Corresponding parts in the embodiments of FIGS. 2 and 3, and FIGS. 5 and 6 are given common identifying numerals. The second embodiment of the invention uses an n-InP substrate 1 having a plane orientation of (100), over the whole surface of which is formed, in the direction of <011>, a periodic structure 17 having a pitch of thickness of about 2,200 Å. Its grooves, about 500 Å in height, extend in the direction of <011>. This periodic structure 17 is produced by a two beam interference exposure process, in which two He-Cd laser beams of 3,250 Å in wavelength are crossed at an angle of about 43°, and by chemical etching. On the periodic structure 17 are grown, one over another, an n-InGaAsP guide layer 2 having a forbidden band wavelength of 1.3 microns and a thickness of 0.3 micron, an InGaAsP active layer 3 having an oscillating wavelength of 1.55 microns and a thickness of 0.1 micron, and a P-InP first cladding layer 4 having a thickness of 2 microns, in that order. Since the optical guide layer has to propagate, with an extremely small loss, the light amplified by the active layer, it is made of a material having a greater forbidden band gap than that of the active layer. Two channels 50 and 40 in the direction of <011> are etched into a multilayered semiconductor wafer 110 until the active layer 3 is penetrated, and a mesa stripe 300 is formed. The etching is so accomplished that each channel is 8 microns wide and the active layer of the mesa, 1.5 microns wide.

Over the multilayered semiconductor wafer 110, except over the top surface of the mesa stripe 300, are successively formed, by a second round of epitaxial crystal growth, a P-InP first current blocking layer or a second cladding layer 5 and an n-InP second current blocking layer or a third cladding layer 6. Further, over the whole upper surface of the mesa stripe 300 and the second current blocking layer 6 are formed a P-InP buried layer or a fourth cladding layer 7 and a P-InGaAsP ohmic layer 8 having a forbidden band wavelength of 1.2 microns. To prevent the growth of blocking layers 5 and 6 over the mesa stripe 300 during the second round of epitaxial growth, it is recommended to use the two-phase solution liquid-phase growth technique by which the material, after being preserved approximately one hour at a soak temperature of 630° C., is cooled at a rate of 0.7° C./minute and the growth is started from 620° C. When the device is forward biased by applying a positive potential to electrode 9 relative to the potential at electrode 10, the current will flow only into the mesa stripe 300 because of the presence of the first and second current blocking layers 5 and 6, resulting in effective laser oscillation. Since the active layer 3 and the guide layer 2 in the mesa stripe 300 are embedded in the InP substrate 1 and the cladding layer 4 in the vertical direction and, in the horizontal direction in the InP first current blocking layer 5, it is possible to cut off high-order modes and achieve stable single-transverse mode oscillation. In addition, because the periodic structure 17 is formed on the boundary between the guide layer 2 and the InP substrate 1, providing distributed feedback to the light wave in the optical guide path consisting of the active layer 3 and guide layer 2, the laser device is capable of stably oscillating only in the axial mode determined by the pitch of thickness of the periodic structure 17.

In this embodiment, the active layer 3 in the mesa stripe 300 is generally not susceptible to damage by contact with a carbon board for liquid-phase growth during the growth of the mesa stripe 300. This results in a remarkably improved yield. This structure gives a single axial and single-transverse mode semiconductor laser manifesting such high performance features as a lasing threshold current of 50 mA and a differential quantum efficiency of 50%, with little fluctuation of oscillating characteristic.

The present invention can conceivably be embodied in many other versions than the foregoing preferred embodiments. The InP substrate 1 may be of the p type, instead of the n type. In that event, the conductivity types of all the grown crystal-line layers will have to be opposite to those of the corresponding layers of these embodiments. The lasing wavelength may be other than 1.55 microns. The guide layer 2 may have a different thickness and a different forbidden band wavelength, and the periodic structure 17 may be formed in an InP cladding layer unless the period structure is lost.

What is claimed is:

1. A double heterostructure semiconductor laser device comprising: a multilayered structure including a semiconductor substrate of one conductivity type, a wide bandgap first layer of the same conductivity type disposed on a major surface of said substrate, a narrower bandgap active region disposed on said first layer, and a wide bandgap second layer of the opposite conductivity type disposed on said active region, said active region being capable of emitting stimulated radiation when said layers are forward biased, either said first or said second layers having on one side thereof a corrugation of a prescribed pitch in the propagating direction of said radiation, said multilayered structure having a portion in the shape of an elongated mesa, which extends in parallel to the propagating direction of said radiation, first and second channels extending along both sides of said mesa, said channels being of a depth which extends from the upper surface of said second layer through said first layer, and remaining portions outside said channels and including said first and second layers and said active region;

wide bandgap third and fourth layers, opposite to each other in conductivity type, formed over said channels and the remaining portions said multilayered structure except for the top surface of said mesa, for blocking a current flow therethrough; and electrode means for applying said forward bias.

2. The double heterostructure semiconductor laser device, as claimed in claim 1, wherein the corrugated structure is positioned in an end portion of said device in the propagating direction of said radiation to constitute a distributed Bragg reflector.

3. The double heterostructure semiconductor laser device, as claimed in claim 2, wherein said active region is absent from said end portion containing said Bragg reflector.

4. The double heterostructure semiconductor laser device, as claimed in claim 2, wherein an end face opposite to said distributed Bragg reflector is so cleaved as to constitute an optical resonator along with said distributed Bragg reflector.

5. The double heterostructure semiconductor laser device, as claimed in claim 4, wherein said substrate has a lower flat part and a higher corrugated part to form said periodic structure within said first layer.

6. The double heterostructure laser device, as claimed in claim 1, wherein the corrugated structure extends along the entire length of said device in the propagating direction of said radiation.

7. A double heterostructure semiconductor laser device comprising a substrate having a first level and a second level higher than said first level, the transition between said first and second levels being in the propagating direction of the laser radiation, a wide bandgap optical guide layer disposed over said first and second substrate levels, a narrow bandgap active layer disposed over said optical guide layer only in the region over said first level, a wide bandgap first cladding layer disposed over said active layer, said second level having formed therein a diffraction grating, first and second channels each extending longitudinally in the direction of laser propagation and having a depth extending at least to said substrate at both its first and second levels, at least a first current blocking layer disposed within said first and second channels, and electrode means for applying a forward bias across said optical guide layer and said first cladding layer, whereby the application of said forward bias causes said active layer to produce stimulated emission radiation.

8. The double heterostructure laser device of claim 7, wherein said first current blocking layer is also disposed over said wide bandgap first cladding layer in the region of said first substrate level and over said optical guide layer in the region of said second substrate level except in the mesa region.

9. The double heterostructure laser device of claim 8, further including a second current blocking layer disposed over said first blocking layer and at least another cladding layer disposed over said second current blocking layer and said mesa region.

10. The double heterostructure laser device of claim 9 further including an optical reflector located at the end of said laser device opposite said diffraction grating in the propagation direction of the laser radiation.

11. A double heterostructure semiconductor laser device comprising a substrate, an optical guide layer disposed over said substrate, a narrow bandgap active layer disposed over said optical guide layer, a wide bandgap first cladding layer disposed over said active layer, first and second channels formed within said device in the direction of laser propagation, having a depth extending from the upper surface of said first cladding layer through said optical guide layer to produce a mesa region bounded by said channels and remaining portions outside said channels, said mesa region and said remaining portions each including said optical guide layer, said active layer and said first cladding layer, at least a first current blocking layer disposed over said first and second channels and said wide bandgap first cladding layer except in the mesa region, a periodic structure formed in the surface of said substrate and extending over the entire surface thereof in the propagation direction of the laser radiation and electrode means for applying a forward bias across said optical guide layer and said first cladding layer to cause said active layer to produce stimulated emission of radiation.

12. The double heterostructure semiconductor laser device of claim 11 further including a second current blocking layer disposed over said first current blocking layer and at least another cladding layer disposed over said second current blocking layer and said mesa region.

13. A double heterostructure semiconductor device, comprising:

a double heterostructure including successively at least a first semiconductor material of a first conductivity type, a second semiconductor material, and a third semiconductor material of a second conductivity type, said second semiconductor material having a narrower bandgap than those of said first and third semiconductor materials and emitting radiation under the forward bias of a p-n junction, said double heterostructure having a stripe portion with channels formed along both sides of said stripe and extending through said third semiconductor material and said second semiconductor material to reach said first semiconductor material, and remaining portions, outside said channels, including said first, second, and third semiconductor materials, either said first or said third semiconductor material shaving on one side a corrugation of a prescribed pitch in the propagating direction of said radiation;

a fourth semiconductor material of the second conductivity type formed over said channels and said remaining portions of said double heterostructure except for the top surface of said stripe portion;

a fifth semiconductor material of the first conductivity type formed over said fourth semiconductor material; and a pair of electrodes for supplying a voltage to forward bias said p-n junction.

14. The double heterostructure semiconductor device as claimed in claim 13, wherein said corrugated portion of said first or said third semiconductor materials is positioned in an end portion of said device in the propagating direction of said emitted radiation to constitute a distributed Bragg reflector.

15. The double heterostructure semiconductor device as claimed in claim 14, wherein said second semiconductor material is absent from said end portion containing said Bragg reflector.

16. The double heterostructure semiconductor device as claimed in claim 15, wherein an end face of said device opposite said distributed Bragg reflector in the propagation direction of said radiation is cleaved to constitute an optical resonator along with said distributed Bragg reflector.

17. The double heterostructure semiconductor device as claimed in claim 13, wherein said corrugated portion of said first or said third semiconductor materials extends along the entire length of said device in the propagating direction of said radiation.

* * * * *

UNITED STATES PATENT AND TRADEMARK OFFICE
CERTIFICATE OF CORRECTION

PATENT NO. : 4,575,851

DATED : March 11, 1986

INVENTOR(S) : Masafumi SEKI et al

It is certified that error appears in the above-identified patent and that said Letters Patent is hereby corrected as shown below:

Column 1, Line 24    "Laser with Distilled Bragg Reflector"

should read

--Laser with Distributed Bragg Reflector--

Signed and Sealed this

Twenty-fifth Day of November, 1986

*Attest:*

DONALD J. QUIGG

*Attesting Officer*      *Commissioner of Patents and Trademarks*